United States Patent [19]

Ansell et al.

[11] Patent Number: 4,862,327
[45] Date of Patent: Aug. 29, 1989

[54] ADAPTER CARD MOUNTING IN A LOW PROFILE MICROCOMPUTER

[75] Inventors: Daniel F. Ansell, Coral Springs; James C. Harris, Boca Raton; Steven E. Howell, Lantana; Michael S. Miller, Delray Beach; Robert D. Wysong, Boca Raton, all of Fla.

[73] Assignee: International Business Machines Corporation, Armonk, N.Y.

[21] Appl. No.: 205,593

[22] Filed: Jun. 9, 1988

Related U.S. Application Data

[63] Continuation of Ser. No. 19,455, Feb. 26, 1987, abandoned.

[51] Int. Cl.⁴ .............................................. H05K 1/14
[52] U.S. Cl. ...................................... 361/415; 211/41; 361/394; 361/399; 361/413
[58] Field of Search ............... 361/394, 399, 412, 413, 361/415, 420; 211/41; 439/61, 62

[56] References Cited

U.S. PATENT DOCUMENTS

| | | | |
|---|---|---|---|
| 2,951,184 | 9/1960 | Wyma | 461/412 X |
| 3,378,730 | 4/1968 | Peehls | 361/413 |
| 3,644,868 | 2/1972 | Nevala | 361/413 X |
| 3,652,899 | 3/1972 | Henschen | 361/412 X |
| 3,691,432 | 9/1972 | Edfors et al. | 361/394 X |
| 3,736,471 | 5/1973 | Donze et al. | 361/415 |
| 3,829,741 | 8/1974 | Athey | 361/412 X |
| 4,068,290 | 1/1978 | Wetherbee | 361/415 |
| 4,089,042 | 5/1978 | Torburn | 361/412 |
| 4,109,300 | 8/1978 | Reimer | 361/415 |
| 4,124,878 | 11/1978 | Ebeer et al. | 361/415 |
| 4,198,024 | 4/1980 | Cavana | 361/413 X |
| 4,277,120 | 7/1981 | Drake et al. | 361/415 X |
| 4,401,351 | 8/1983 | Record | 439/61 |
| 4,439,237 | 9/1982 | Cobaugh et al. | 361/415 X |
| 4,442,476 | 4/1984 | Lenderking et al. | 361/415 X |
| 4,462,499 | 7/1984 | Calabro | 361/399 X |
| 4,498,717 | 2/1985 | Reimer | 439/61 |
| 4,507,707 | 3/1985 | Willis | 361/415 X |
| 4,550,362 | 10/1985 | Reimer | 361/415 |
| 4,563,722 | 1/1986 | Maroney et al. | 361/415 X |
| 4,635,326 | 1/1987 | Yagi | 361/412 X |
| 4,669,616 | 6/1987 | Mazura | 361/415 X |

FOREIGN PATENT DOCUMENTS 2431788 1/1976 Fed. Rep. of Germany ........ 439/61

OTHER PUBLICATIONS

J. L. Neubauer, Electronic Card Retainer Unit, IBM Tech. Disc. Bull. v. 20 #7, Dec. 1977, pp. 2794 and 2795.
Card/Crossover Retention Assembly, IBM Tech. Disc. Bull., V 29, #2, Jul. 1986, pp. 621–622.

Primary Examiner—R. R. Kucia
Attorney, Agent, or Firm—Pollock, Vande Sande & Priddy

[57] ABSTRACT

In a low profile microcomputer, adapter cards are mounted horizontally in order to be able to use adapter cards designed for earlier, higher, machines. The cards are coupled to the microcomputer planar board by an extender card which extends vertically from the planar and has sockets extending horizontally when the card is in position. The adapter cards have edge connections which couple to these sockets. A removable bridge device is coupled between the top of the extender card and a vertical wall of the microcomputer to minimize horizontal movement of the extender card. For adapter cards which do not extend fully between the front and rear walls of the microcomputer, a channelled support arm, which fits over an end of a card, and is removably mounted on a vertical wall of the computer for slidable engagement with the card.

11 Claims, 4 Drawing Sheets

4,862,327

ADAPTER CARD MOUNTING IN A LOW PROFILE MICROCOMPUTER

This a continuation of co-pending application Ser. No. 019,455 filed on Feb. 26, 1987 now abandoned.

TECHNICAL FIELD

The present invention relates to mounting adapter cards used for, for example, communication facilities, in a low profile microcomputer, or in other words a microcomputer having a relatively low height dimension.

BACKGROUND TO THE INVENTION

With the exception of some of the lowest price small systems, all microcomputers include means for mounting and connecting adapter cards in a housing. Such cards include those employed for communications, i.e. internal modems, those used to drive displays, to couple keyboards and to provide memory expansion.

In the following description, we refer to vertical and horizontal mounting of the adapter cards in the housing. The cards to which reference are made are planar in form. That is, while each card has a length, width and depth (or thickness), the length and width dimensions are very much greater than the depth (or thickness) dimension so it is natural to refer to the card as having a plane. The orientation of the housing can be referenced relative to a planar board within the housing. If an adapter card is mounted with its plane oriented perpendicular to the planar card, it is sometimes referred to as being mounted vertically.

In most systems these cards are mounted vertically or perpendicular to the planar card. Normally the microcomputer planar board, which contains most of the processing components, carries a plurality of sockets which extend upwardly from the planar board. Each adapter card has a plug portion which fits into a socket to connect the card adapter to the planar and partially support it in position. Normally each card also has a metal bracket mounted at its rear end. This bracket, on which may be mounted plugs or sockets for connection of external devices to the card, is normally secured to the rear surface of the microcomputer to further support the card and to prevent its displacement when a plug or socket is coupled to a bracket mounted device.

In the art, a number of systems in which plurality of adapter cards plug into a common extender and have been shown. An example of such a system is shown in U.S. Pat. No. 3,675,083 (White). In this system, an extender connector system has sockets for receiving and coupling a plurality of cards. The cards are plugged into the extender by means of plug connections on the rear ends of the cards. The cards, when coupled to the extender connection system are positioned in parallel with each other vertically and the extender card is also mounted vertically. With reduction in the size of the housing of the microcomputer, and in particular reduction in height, a problem arises when it is desired to accommodate adapter cards developed for original use in a prior housing design of a machine. It is, of course, desirable to minimize cost to a user when he migrates from one machine to a later one. One way in which this can be achieved is to allow him to use the same adapter cards. If, however the adapter card width is greater than the height of the new system, the cards can not be mounted vertically.

It is, therefore, an object of the invention to provide means for mounting adapter cards horizontally in a low profile microcomputer system.

It is further object of the invention to provide means for minimizing horizontal and vertical movement of an adapter card when mounted horizontally.

DISCLOSURE OF THE INVENTION

In accordance with the invention, a microcomputer includes adapter card mounting means comprising card connector means mounted on a horizontal planar printed circuit board, extender card means for mounting vertically in said card connector means, said extender card means having mounted thereon a plurality of connector means for mounting adapter cards in the connector means of the extender card horizontally above said planar board, first means releasably coupled between said extender card and a vertical wall in the microcomputer for maintaining the horizontal position of the top of the extender card, and second means slidably mounted to a vertical wall in the microcomputer for engagement with an end of a said adapter card to support said end vertically.

In accordance with the invention, the adapter cards are mounted in parallel with the planar card, both being mounted horizontally.

DETAILED DESCRIPTION

Figure 1:
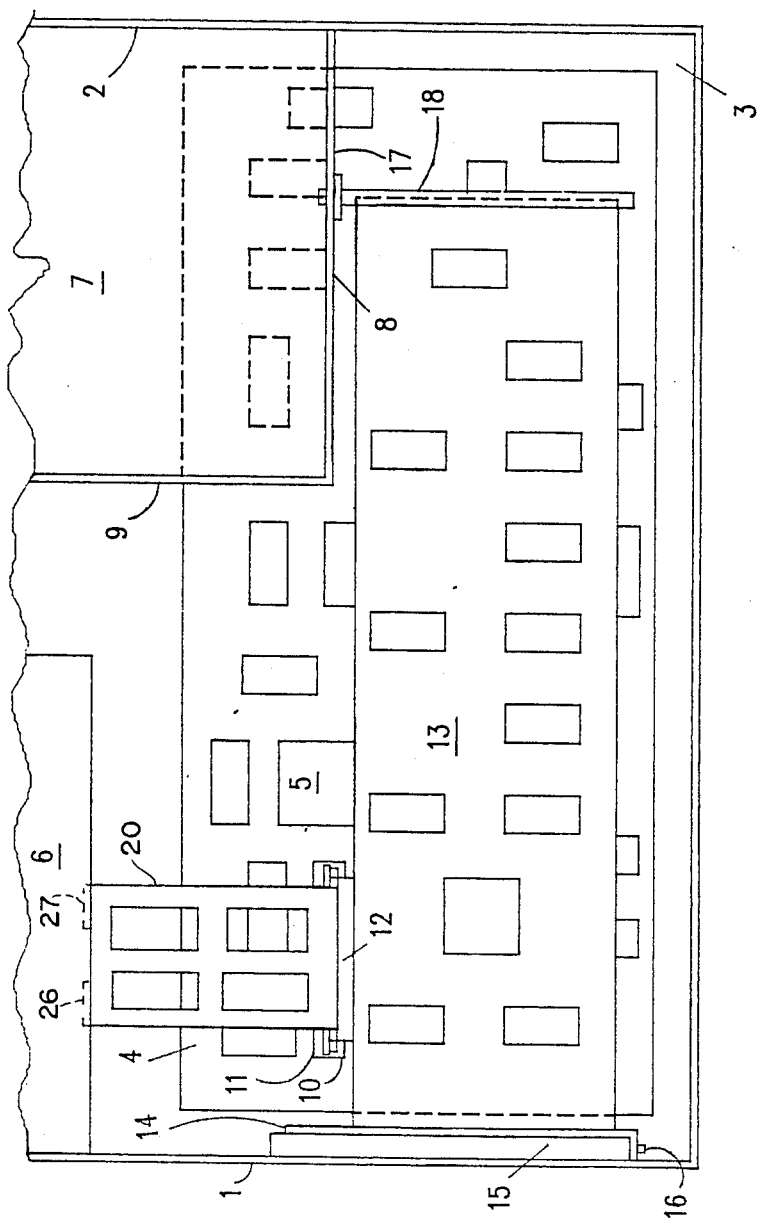
FIG. 1 is a top view of a microcomputer system partially broken away, and with the top cover removed.

Referring to FIG. 1, there is shown therein a microcomputer system with a housing having a rear wall 1, a front wall 2 and a floor 3. A planar board 4 is mounted on floor 3 and carries electronic components of the microcomputer, such as a microprocessor 5. These components are soldered to printed wiring carried by planar board 4. An enclosed power supply 6 is mounted to floor 3 and rear wall 1. A tray including a side wall 8 a rear wall 9 and a floor 7 is mounted to front wall 2. This tray does not extend down to floor 3, and its floor 7 extends over and above part of planar board 4 as shown. The tray is adapted to receive and support removable components, such as disk drive memories, placed thereon through a suitable aperture (not shown) in the front panel.

Planar board 4 carries a socket 10 which is soldered to the board wiring and extends upwardly from the board. This socket is designed to accept an edge connector of an extender card 11 such that, when in place in the socket, the extender card stands substantially perpendicular to the planar board. The extender card carries a plurality of sockets, such as socket 12, each of which extends normally from the card surface. Each socket is adapted to accept an edge connector of an adapter board, such as board 13, so that each board, when so engaged, extends outwardly from the extender card and horizontally parallel to planar board 4 as shown. At the rear end of the adapter card, there is mounted a metal bracket 14 which covers a part 15 and is secured to this part by a screw 16. This arrangement of coupling to a part is identical to that employed in the Personal Computer manufactured by International Business Machines Corporation, except that the part is horizontal rather than vertical.

Figure 2:
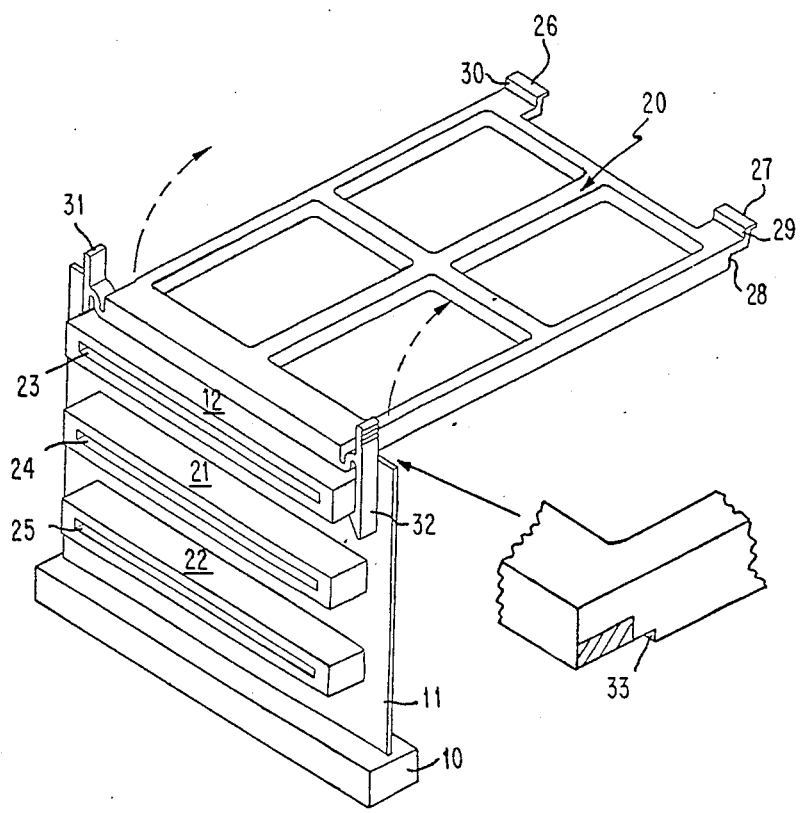
FIG. 2 is a diagram showing a perspective view of an extender card shown in FIG. 1 and a support bridge for the extender card.

FIG. 2 shows the extender card arrangement and a magnified detail of a corner of a support bridge 20. As can be seen in this figure, extender card 11 plugs into, and is supported by, socket 10, which, as has been previously explained, is soldered to the planar board. The extender card carries three sockets 12, 21 and 22 each of which carries a plurality of socket connections (not shown) in respective slots 23 through 25. These slots and connectors are arranged to accept edge connections on adapter cards. When plugged into a socket, an adapter card is coupled to to data, address, and control busses of the planar board 4 through the socket (for example ant of 12, 21 and 22), wiring (not shown) on the extender card 11 and finally through socket 10.

In order to prevent horizontal movement of extender card 11, support bridge 20 is provided to support the top of the extender card against such movement. Bridge 20 includes, at one end, tab portions 26 and 27 adapted to pass through apertures in the wall of power supply 6 as shown in FIG. 1. These apertures, which are not shown, are rectangular in shape, and the wall thickness of the power supply is such that, with the bridge in the position shown in FIG. 2, the tabs 26 and 27 are a snug fit in the apertures with surface 28, which extends right across the bridge, engaging the outside of the power supply wall and with surfaces 29 and 30 engaging the inside surface of this wall. The bridge is placed into the power supply wall apertures by placing the outwardly extending portions of the tabs into the apertures, then swinging the bridge in the direction of the curved arrows, and then returning it to the FIG. 2 position.

At the end of bridge 20 opposite tabs 26 and 27, grippers 31 and 32 are formed. Each of these grippers comprises an arm having a upper portion above and a lower portion below, a serpentine spring section coupling the arm to the main body of the bridge. The bridge is a one-piece plastic molding, and the serpentine sections are of a dimension such that, with the plastic material utilized, the arms can be pivoted about the junction of the spring portion and the main body. At the lower end of each gripper, and as shown on gripper 32, there is a horizontal surface under which a sloping surface continues to the end of the lower arm portion. This horizontal surface is adapted to engage the under surface of socket 12 when bridge 20 is in position as shown. To remove the bridge from extenders card 11, the serrated portions of the upper portions of the gripper arms are squeezed manually so that the grippers pivot away from the ends of socket 12. The bridge can then be moved in the direction of the dotted arrows. This removability is useful if, for example, it is required to inspect some part of the planar board (FIG. 1) in the vicinity below the bridge. When it is again required to place the bridge in its operative position, the direction of the phantom arrows is reversed and the grippers 31 and 32 latch over the socket 12. The enlarged inset drawing in FIG. 2 shows the corner of bridge 20 adjacent gripper 32. This gripper and its serpentine spring portion have been cut away from the inset drawing. What this drawing shows is a ledge 33 formed in the bridge. This ledge passes right across the bridge under the forward arm thereof. The ledge engages the rear surface of extender card 11 when bridge 20 is in its operative position. The extender card is, therefore, held between the ledge and rear faces of grippers 31 and 32 to prevent vertical movement thereof.

Figure 3:
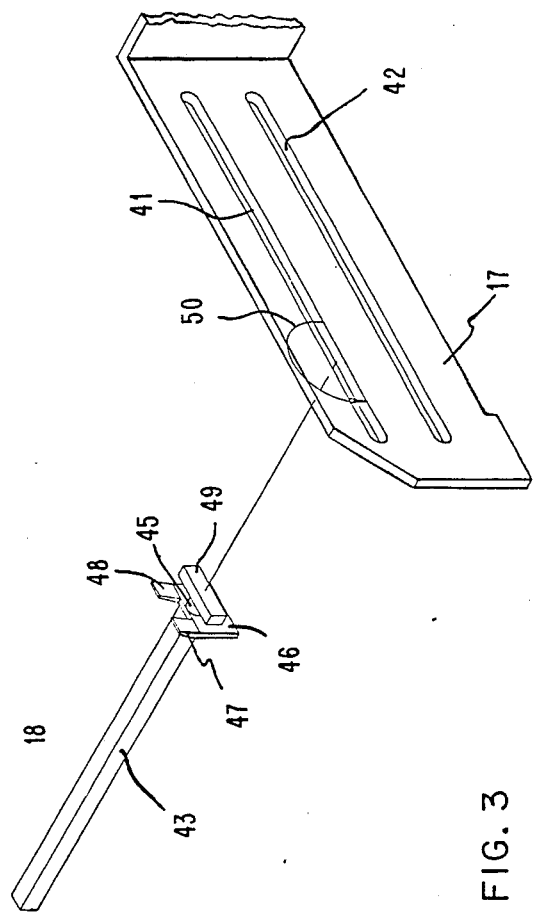
FIG. 3 is a perspective view of an adapter card support member showing slots in a vertical wall in the microcomputer of FIG. 1 into which the member can be fitted.
Figure 4:
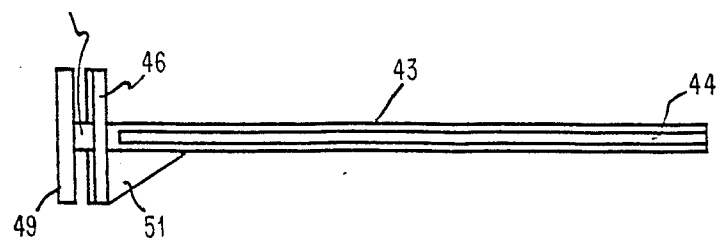
FIG. 4 is a detailed side view of the support member of FIG. 3.
Figure 5:
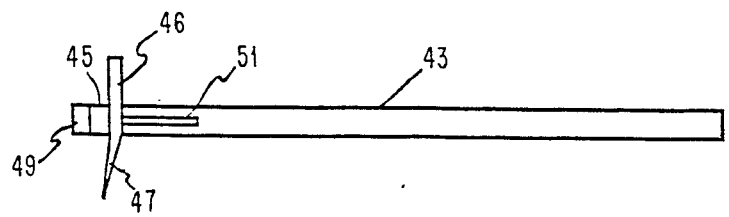
FIG. 5 is a detailed bottom view of the support member of FIG. 3.

FIGS. 3 through 5 show details of a device for supporting the end of an adapter card adjacent the front of the microcomputer of FIG. 1. This device comprises an arm assembly 18 which engages the end of the adapter card and is slidably fitted in a side wall 17 of tray 7. As can be seen in FIG. 3, side wall 17 has slots 41 and 42 formed therein. It is noted that while the extender card has three sockets for supporting three adapter cards, only two slots for two such cards are provided in wall 17. This is because firstly, in this particular embodiment, tray 7 (FIG. 1) is spaced above planar 4 at a distance such that there can be no corresponding slot in side wall 17 and secondly, many adapter cards are full length and can be supported by known fixtures at the front wall 2 of the microcomputer. Accordingly, the lowest adapter card, i.e. that fitting into socket 22 (FIG. 2), should be a full length card. The term "length" is used in its generally accepted definition as the longer of the two straight-line dimensions of a surface or plane or the longest of the three straight line dimensions of a solid. In a similar connection, the term "width" is used in its generally accepted sense of a measure taken at right angles to length and the term "depth" is used in its generally accepted definition as a perpendicular measurement downward from a surface.

Referring now to FIG. 3 through 5 in detail, the adapter arm assembly 18 comprises an arm 43 having a channel 44 formed therein. This channel is dimensioned to engage and snugly fit an end of an adapter card as shown in FIG. 1. Arm 43 has a rounded extension 45 at the ends of which are spaced a flat platform 46 having extended ears 47 and 48 and rectangular cross sectioned bar 49. The diameter of rounded extension 45 is such as to fit into one of the slots 41 and 42 and its length is such as to fit easily into the slot. As can be seen in FIG. 3, in operation bar 49 is pushed through a slot and then adapter arm 18 is turned in a counterclockwise direction as indicated by arrow 50. Bar 49 and platform 46 then sandwich a portion of wall 17 to retain arm 18 on the wall. When the arm is in position on the wall, ears 47 and 48 take up any slack but permit sliding movement of the adapter arm along the slot. It is noted, particularly from FIGS. 3 and 5, that ears 47 and 48 reduce in thickness from the end attached to platform to the free end. This gives them sufficient flexibility to act as springs, and, as they slope away from arm 43 they provide spring pressure pulling bar 49 towards the wall. In addition, it can be seen that the ears are on the side of platform 46 away from the opening of channel 44 in arm 43. Thus, when the adapter arm is fitted to wall 17 and slid towards and into contact with the end of an adapter card, the spring effect of ears 47 and 48 tend to push arm 43 into close contact with the adapter card. Lastly, a filet 51 (FIGS. 4 and 5, but hidden in FIG.3), filling in a corner between arm 43 and platform 46, serves to strengthen and increase the rigidity of the integrated platform 46/arm 43 structure.

In summary, what has been disclosed is means for mounting adapter cards horizontally in a low profile microcomputer. The cards are coupled to the planar board of the microcomputer through a vertical extender card which is supported against vertical movement by a removable bridge coupled between the top of the extender card and a vertical wall in the microcomputer. One end of a card which is not sufficiently long to extend between the front and rear walls of the microcomputer is supported by a removable adapter arm. This arm has a channel which is dimensioned to engage the end of the card. It is slidably supported in a slot in a further vertical wall of the microcomputer.

While the invention has been particularly shown and described with reference to a preferred embodiment thereof, it will be understood by those skilled in the art that various changes in form and detail may be made without departing from the spirit and scope of the invention.

We claim:

1. A microcomputer system including: a housing; a planar board carrying components of the microcomputer system and mounted in the housing; and means for mounting optional adapter cards within the housing, each adapter card having principally a length and width dimension, the length and width dimensions of some adapter cards rendering such cards unmountable in said housing in an orientation where their planes are perpendicular to said planar board, said mounting means comprising:
   (a) first socket means connected to and supported by said planar board;
   (b) an extender card pluggable into and supportable by said first socket means to extend substantially perpendicular to said planar board;
   (c) at least one second socket means connected to and supported by said extender card, each second socket means for accepting an edge connector of an adapter card mounted substantially parallel to said planar board, thereby permitting mounting of optional adapter cards within the housing notwithstanding a width dimension of an adapter card being larger than said height dimension of said housing.

2. A microcomputer system according to claim 1 in which said support means includes a platform mounted at, and normal to, one end of said channelled arm, a circular cross-section extension mounted from the platform co-axially with said channelled arm, and a bar mounted at right angles to, and at the end of, said extension, the diameter of the extension and width of the bar being substantially that of the width of said slot, and the length of the bar being substantially greater than the width of said slot, and the length of said extension being substantially that of the thickness of the support wall defining the slot.

3. A microcomputer according to claim 2, including ear elements mounted on said platform, said ear elements for applying spring pressure to said support wall supporting said channelled arm between said platform and said bar.

4. A microcomputer system according to claim 1 wherein the support wall includes at least one slot; wherein the bridge means includes means for removably engaging at least one slot in the support wall; and means for removably engaging one of said second socket means in the extender card when the extender card is mounted in said first socket means.

5. A microcomputer system according to claim 4 wherein the second socket means includes first and second ends; and wherein said means for removably engaging the second socket means comprises first and second means for engaging said first and second ends of said second socket means, said first and second means being resiliently attached to said bridge means.

6. A microcomputer system according to claim 5 in which said first and second means for engaging comprise latch means each having a sloping surface for initial engagement with the second socket means and means conforming with the profile of the second socket means for final locking engagement therewith.

7. A microcomputer system according to claim 6 in which the bridge means includes a step adjacent said latch means for engaging said extender card between an edge of said latch means and said step.

8. A microcomputer system according to claim 1 wherein the housing includes a support wall oriented substantially parallel to the extender card; and including bridge means mounted between the extender card and said support wall to form a reinforcing bridge therebetween for minimizing movement of the extender card.

9. A micrcomputer system according to claim 8 wherein the bridge means in removably mounted between the extender card and support wall.

10. A microcomputer system according to claim 1 wherein the housing includes a support wall oriented substantially perpendicular to the planar board, said support wall including a slot; and including support means mounted in said slot of said support wall for slidable movement into engagement with an adapter card when the adapter card is mounted substantially parallel to the planar board to support said adapter card in its parallel orientation to the planar board.

11. A microcomputer system according to claim 10 wherein each of the adapter cards has a substantially uniform thickness; and wherein the support means includes a channeled area for enclosing the thickness of an adapter card substantially along a width dimension at one end of said adapter card thereof for supporting that end of the card in its mounting parallel to the planar board.

* * * * *